(12) United States Patent
Tran et al.

(10) Patent No.: US 6,577,549 B1
(45) Date of Patent: Jun. 10, 2003

(54) WRITE CURRENT COMPENSATION FOR TEMPERATURE VARIATIONS IN MEMORY ARRAYS

(75) Inventors: Lung T. Tran, Saratoga, CA (US); Manoj K. Bhattacharyya, Cupertino, CA (US)

(73) Assignee: Hewlett-Packard Company, L.P., Houston, TX (US)

( * ) Notice: Subject to any disclaimer, the term of this patent is extended or adjusted under 35 U.S.C. 154(b) by 0 days.

(21) Appl. No.: 10/254,559

(22) Filed: Sep. 25, 2002

Related U.S. Application Data

(62) Division of application No. 09/998,216, filed on Dec. 3, 2001.

(51) Int. Cl.$^7$ .............................. G11C 7/04; G11C 11/34
(52) U.S. Cl. .................... 365/211; 365/212; 365/213
(58) Field of Search ................................ 365/211, 212, 365/213

(56) References Cited

U.S. PATENT DOCUMENTS

| | | | | |
|---|---|---|---|---|
| 5,784,328 A | * | 7/1998 | Irrinki et al. ............... | 365/222 |
| 6,069,821 A | * | 5/2000 | Jun et al. ............... | 365/185.21 |
| 6,385,082 B1 | * | 5/2002 | Abraham et al. ........... | 365/171 |

* cited by examiner

Primary Examiner—David Nelms
Assistant Examiner—Ly Duy Pham

(57) ABSTRACT

A memory device includes a memory array having a substrate, an array of memory cells disposed over the substrate, row conductors coupled to the memory cells, and column conductors coupled to the memory cells. The memory device also includes current sources that generate variable write currents in response to temperature changes in the memory array. The variable write currents are generated to accommodate the change in coercivities of the memory cells as the temperature of the array changes. A current source can include a temperature sensor that provides a continuous, immediate output to the current sensor to ensure accurate adjustment of a write current generated by the current source. There is no need to halt operation of the memory device to calibrate the current source. In addition, the current source provides an accurate adjustment to the write current because the temperature used by the temperature sensor to generate the output may be taken contemporaneously with generation of the write current.

6 Claims, 10 Drawing Sheets

WRITE CURRENT COMPENSATION FOR TEMPERATURE VARIATIONS IN MEMORY ARRAYS

This is a divisional of copending application Ser. No. 09/998,216 filed on Dec. 3, 2001, which is hereby incorporated by reference herein.

TECHNICAL FIELD

The technical field is cross point memory devices. More specifically, the technical field is memory devices having write circuitries that vary write currents in order to compensate for coercivity changes that occur as a result of temperature variations in a memory array.

BACKGROUND

Magnetic Random Access Memory (MRAM) is a proposed type of non-volatile memory. Accessing data from MRAM devices is much faster than accessing data from conventional long term storage devices such as hard drives. FIG. 1 illustrates a conventional MRAM memory array 10 having resistive memory cells 12 located at cross points of row conductors 14 and column conductors 16. Each memory cell 12 is capable of storing the binary states of "1" and "0."

FIG. 2 illustrates a conventional MRAM memory cell 12. The memory cell 12 includes a pinned layer 24 and a free layer 18. The pinned layer 24 has a magnetization that has a fixed orientation, illustrated by the arrow 26. The magnetization of the free layer 18, illustrated by the bi-directional arrow 28, can be oriented in either of two directions along an "easy axis" of the free layer 18. If the magnetizations of the free layer 18 and the pinned layer 24 are in the same direction, the orientation of the memory cell 12 is "parallel." If the magnetizations are in opposite directions, the orientation is "anti-parallel." The two orientations correspond to the binary states of "1" and "0," respectively. The free layer 18 and the pinned layer 24 are separated by an insulating tunnel barrier layer 20. The insulating tunnel barrier layer 20 allows quantum mechanical tunneling to occur between the free layer 18 and the pinned layer 24. The tunneling is electron spin dependent, making the resistance of the memory cell 12 a function of the relative orientations of the magnetizations of the free layer 18 and the pinned layer 24.

Each memory cell 12 in the memory array 10 can have its binary state changed by a write operation. Write currents Ix and Iy supplied to the row conductor 14 and the column conductor 16 crossing at a selected memory cell 12 switch the magnetization of the free layer 18 between parallel and anti-parallel with the pinned layer 24. The current Iy passing through the column conductor 16 results in the magnetic field Hx, and the current Ix passing through the row conductor 14 results in the magnetic field Hy. The fields Hx and Hy combine to switch the magnetic orientation of the memory cell 12 from parallel to anti-parallel. A current –Iy can be applied with the current Ix to switch the memory cell 12 back to parallel.

In order to switch the state of the memory cell 12 from parallel to anti-parallel, and vice versa, the combined field created by +/–Hx and Hy exceeds a critical switching field Hc of the memory cell 12. The current magnitudes for Ix and Iy must be carefully selected because if Hx and Hy are too small, they will not switch the orientation of the selected memory cell 12. If Hx and Hy are too large, memory cells 12 on the row conductor 14 or the column conductor 16 of the selected memory cell 12 may be switched by the action of either Hx or Hy acting alone. These unselected memory cells 12 are referred to as "half-selected" memory cells.

A problem arises in conventional MRAM arrays because operating an array and ambient temperature changes may cause the temperature of the array to vary, which causes the coercivity of the memory cells to change. A change in coercivity of the memory cells changes the critical switching field Hc, which in turn changes the fields Hx and Hy required to switch the state of the cells. This condition increases the likelihood that an entire row or column of half-selected memory cells will be programmed due to the action of Ix or Iy alone, or the likelihood that the write currents Ix and Iy will be insufficient to switch a selected memory cell.

A need therefore exists for a memory device capable of accurately compensating for coercivity changes in a memory array. A need also exists for a memory device capable of compensating for coercivity changes without undue complexity.

SUMMARY

According to a first aspect, a memory device comprises a memory array having a substrate, an array of memory cells disposed over the substrate, a plurality of row conductors coupled to the memory cells, and a plurality of column conductors coupled to the memory cells. The memory device also includes one or more current sources that generate variable write currents in response to temperature changes in the memory array. The variable write currents are generated to accommodate changes in coercivity of the memory cells as the temperature of the array changes. A current source includes a temperature sensor that may provide a continuous, immediate output to ensure accurate adjustment of write currents generated by the current source.

According to the first aspect, the current source can automatically compensate for temperature variations in the array according to the output from the temperature sensor. There is no need to halt operation of the memory device to calibrate the current source. Also according to the first aspect, the current source provides an accurate adjustment to the write current because the temperature used by the temperature sensor to generate the output may be taken contemporaneously with generation of the write current.

Also according to the first aspect, the adjustment of the write currents may be effected by an analog input from the temperature sensors. Digital processing is not required in order to adjust the write currents, reducing the complexity of the memory device.

According to a second aspect, a method of generating a write current in a memory device includes the steps of applying a first voltage to a temperature sensor, enabling a write current to flow to one of a plurality of conductors, receiving an output from the temperature sensor at the current source, and adjusting the write current according to the output from the temperature sensor.

According to the second aspect, the write current generated can be adjusted without halting device operation. The write current is appropriate for switching the memory cells in the memory array because the temperature used by the temperature sensor to generate the output may be taken contemporaneously with generation of the write current. In addition, the write current can be generated using analog operations, which reduces the complexity of the write process.

Other aspects and advantages will become apparent from the following detailed description, taken in conjunction with the accompanying figures.

DESCRIPTION OF THE DRAWINGS

The detailed description will refer to the following drawings, in which like numerals refer to like elements, and in which.

DETAILED DESCRIPTION

A memory device capable of providing variable write currents to compensate for temperature variations in the memory device will be discussed by way of preferred embodiments and by way of the figures.

Figure 1:
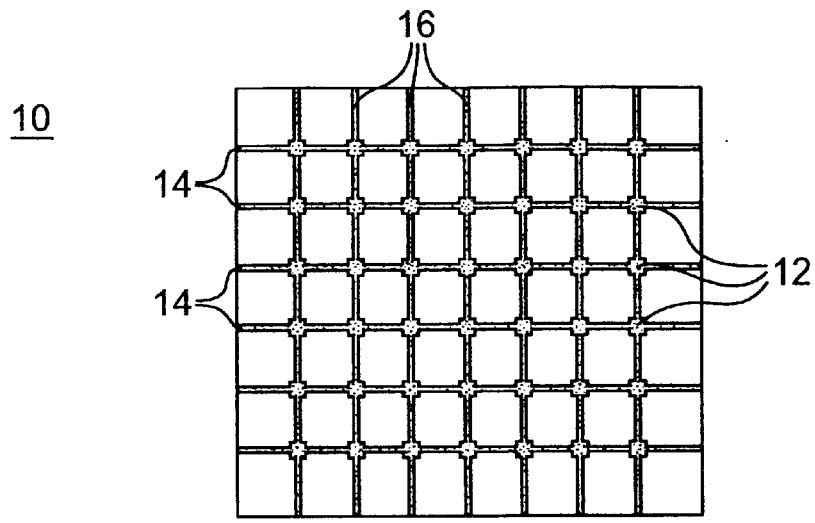
FIG. 1 illustrates a conventional memory array.
Figure 2:
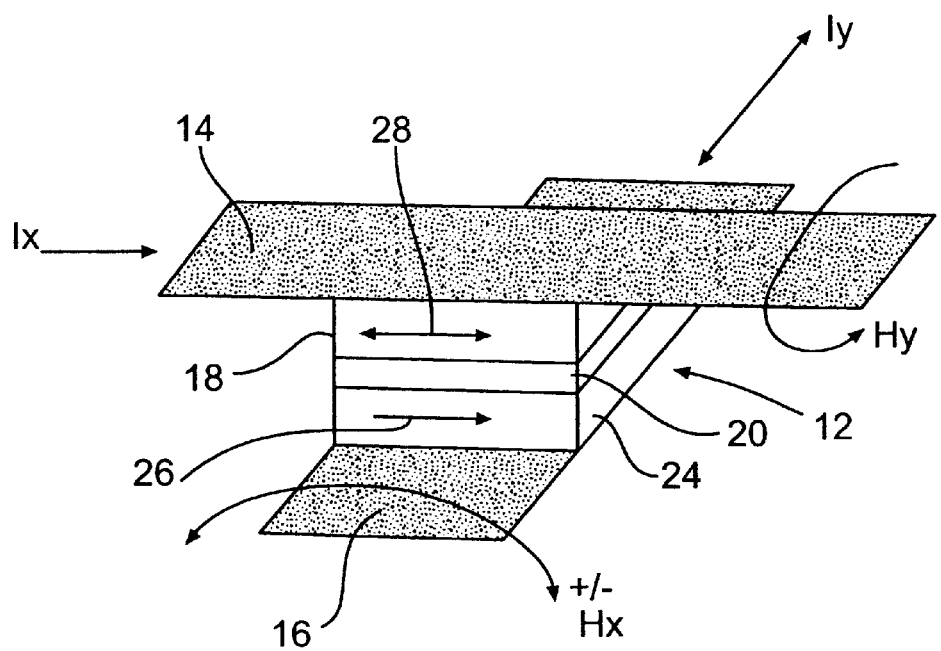
FIG. 2 illustrates binary states of a conventional memory cell.
Figure 3:
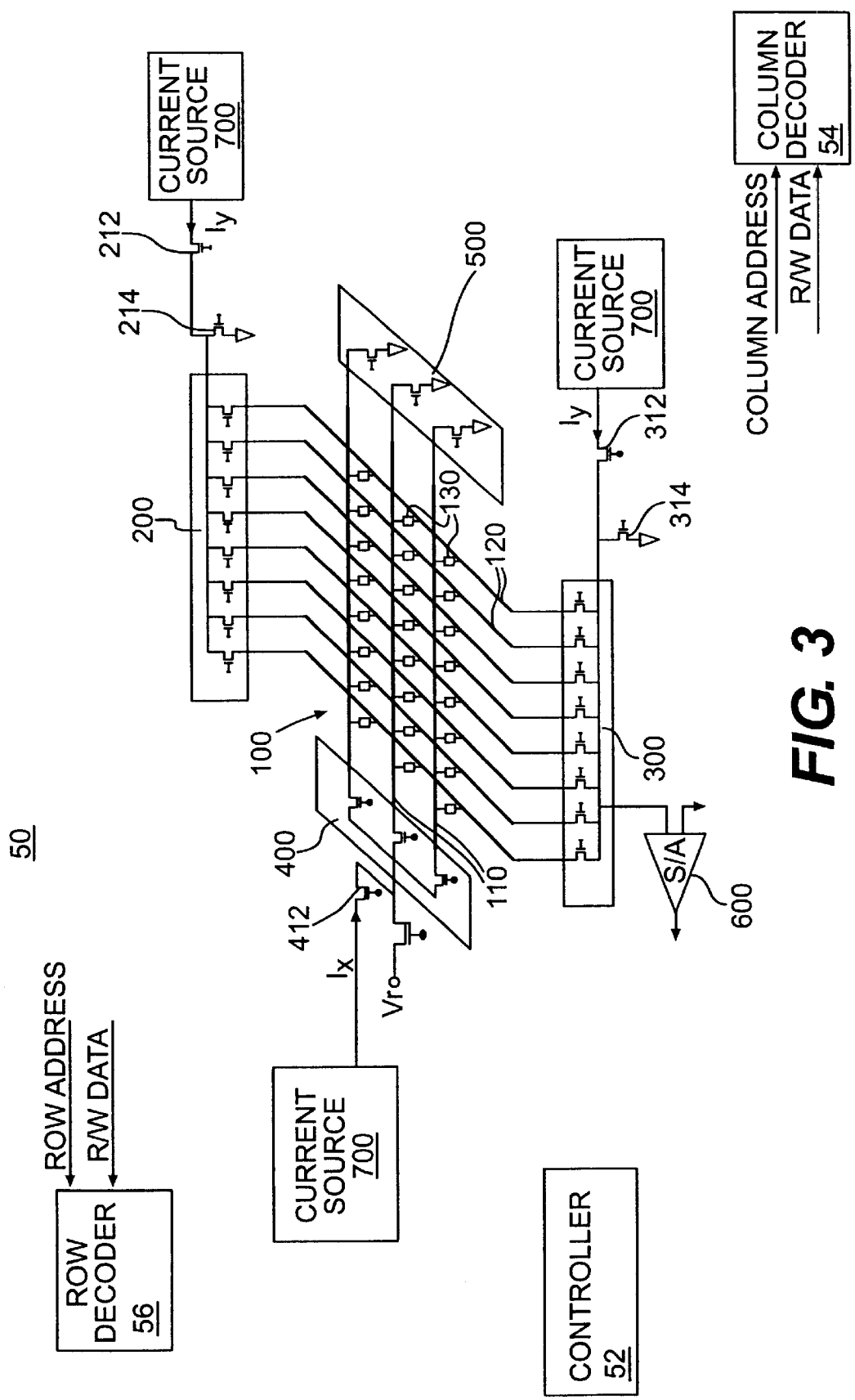
FIG. 3 is a schematic view of an embodiment of a memory device.

FIG. 3 is a schematic view of a memory device 50. The memory device 50 includes a controller 52, a column decoder 54, a row decoder 56, a memory array 100, a bank 200 of write select switches, a bank 300 of read/write select switches, a bank 400 of read/write select switches, a bank 500 of write termination select switches, a sense amplifier 600, and current sources 700. While the memory device 50 is illustrated as having three identical current sources 700, other embodiments of current sources can be used at one or more locations in the memory device 50. Embodiments of current sources are discussed in detail with reference to FIGS. 7–10.

The controller 52 controls read and write operations of the memory device 50. The controller 52 is coupled to the row decoder 56 to transmit commands to the row decoder 56, including read/write (R/W) data and address data. The row decoder 56 is coupled to the gates of the switches in the switch banks 400 and 500, and opens and closes the switches in accordance with the controller 52 instructions. Similarly, the controller 52 is coupled to the column decoder 54, which is coupled to the gates of the switches in the switch banks 200, 300. The switches of the memory device 50 are illustrated as transistors. However, switches such as, for example, FET or MOSFET switches, and other switches, can also be used.

The memory array 100 stores data for the memory device 50. In the memory array 100, row conductors 110 extend in horizontal rows, and column conductors 120 extend in vertical columns. The row conductors 110 cross the column conductors 120 at memory cells 130. Each memory cell 130 can store a binary state of either 1 or 0. In FIG. 3, three rows of row conductors 110 and eight columns of column conductors 120, intersecting at twenty-four memory cells 130, are shown for the purposes of illustration. In practice, arrays of 1024×1024 memory cells and larger, for example, may be used.

The bank 200 of write select switches selectively couples the column conductors 120 to a column write current Iy from a current source 700, or to ground via a switch 214. The current source 700 coupled to the bank 200 serves as a column write current source. A switch 212 selectively couples the column write current source 700 to the bank 200 of write select switches. The bank 300 of read/write select switches selectively couples the column conductors 120 to a column write current Iy from a current source 700, or to ground via a switch 314. The bank 300 also selectively couples the column conductors 120 to the sense amplifier 600. The current source 700 coupled to the bank 300 serves as a column write current source. The bank 400 of read/write select switches selectively couples the row conductors 110 to a read voltage Vr through a switch 414, and to the row write current Ix via a switch 412. The bank 500 of write termination select switches selectively couples the row conductors 110 to ground. The current source 700 coupled to the bank 400 serves as a row write current source.

In order to write a state of 1, or an anti-parallel state, to a memory cell 130 in the memory array 100, the column write current Iy is supplied to the column conductor 120 of the column in which the selected memory cell 130 is located, from the current source 700 coupled to the bank 200. The row write current Ix is simultaneously supplied to the row conductor 110 of the row in which the selected memory cell 130 is located. The magnetic fields Hy and Hx generated by the write currents Ix and Iy combine to change the binary state of the memory cell 130 from 0 to 1. To write a state of 0 to a memory cell 130, the row write current Ix is applied as above, and the column write current Iy is applied from the current source 700 coupled to the bank 300. The write current Iy from the current source 700 coupled to the bank 300 may be considered as "–Iy," and the write current Iy from the current source 700 coupled to the bank 200 can be considered as "+Iy."

During operation of the memory device 50, the write currents Ix and Iy generate heat in the memory array 100. In addition, support circuitries in the memory device 50 generate heat. These factors, along with a changing ambient temperature, cause the temperature of the memory device 50 to vary. The changing temperature causes the coercivities, and therefore the critical switching fields Hc, of the memory cells 130 to vary during operation of the device 50. In the memory device 50 illustrated in FIG. 3, the current sources 700 generate variable write currents Iy, Ix that vary to compensate for the coercivity changes. The current sources 700 can either include, or can be connected to, temperature sensors. The temperature sensors sense the temperature of the memory array 100 and provide an output to the current sources 700. The outputs from the temperature sensors adjust Ix and Iy to compensate for the coercivity changes in the memory cells 130. The relationship between coercivity and temperature is discussed below with reference to FIG. 4.

Figure 4:
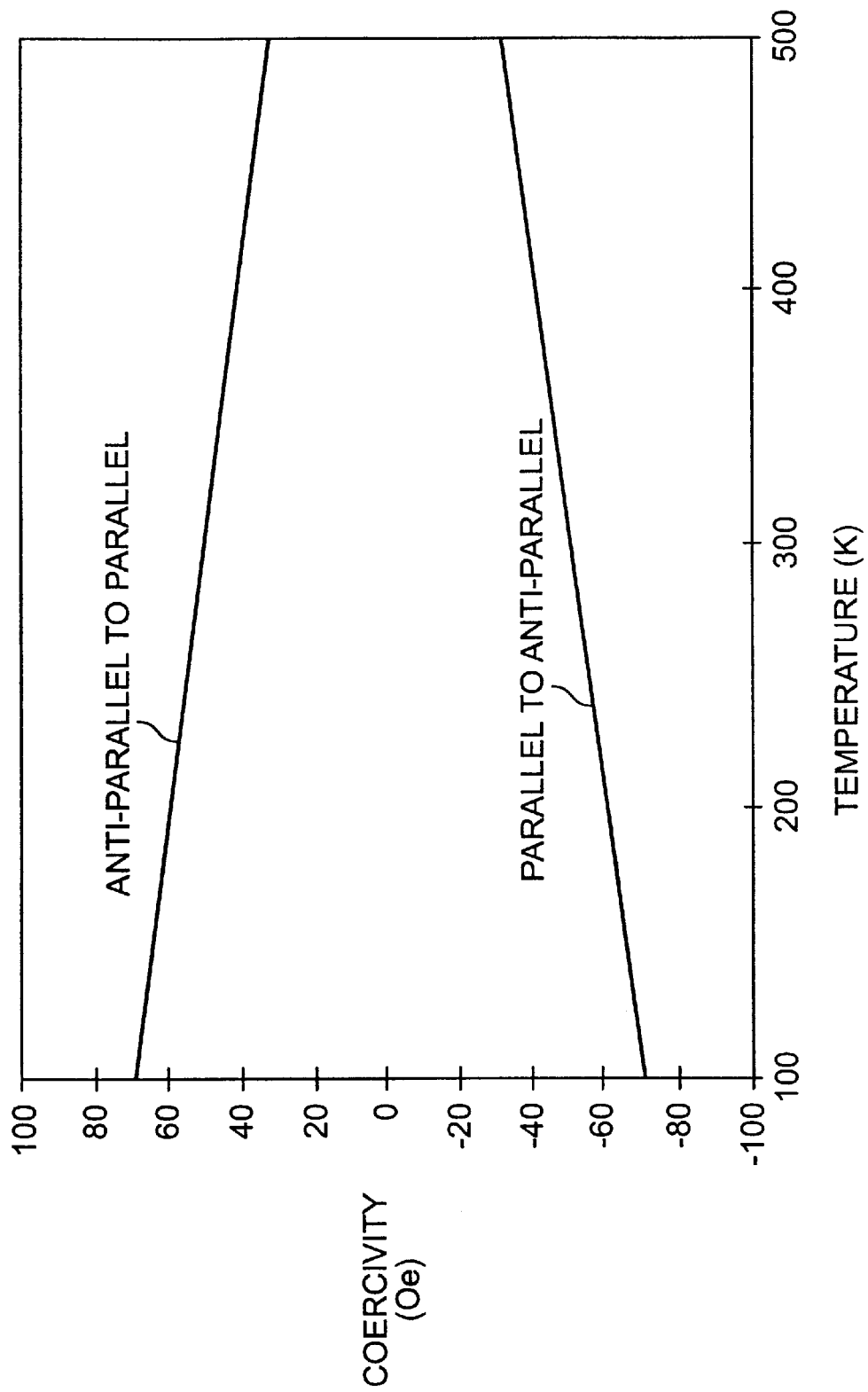
FIG. 4 is a plot of coercivity, or critical switching current, versus temperature for a memory cell.

FIG. 4 is a plot of coercivity, or critical switching field Hc, versus temperature for a memory cell 130. The critical switching field Hc for switching a memory cell 130 from anti-parallel to parallel decreases with increasing temperature. The critical switching field Hc for switching a memory cell 130 from parallel to anti-parallel increases with increasing temperature. In both cases, the magnitude of Hc decreases with increasing temperature. The data shown in FIG. 4 are simulation data illustrating symmetry of switching between binary states. During operations of the memory device 50, such as when write currents Ix and Iy are applied to selected memory cells 130 in the memory array 100, the temperature of the memory array 100 will vary. The temperature variations in the memory array 100 therefore change the required write currents Ix and Iy.

Figure 5:
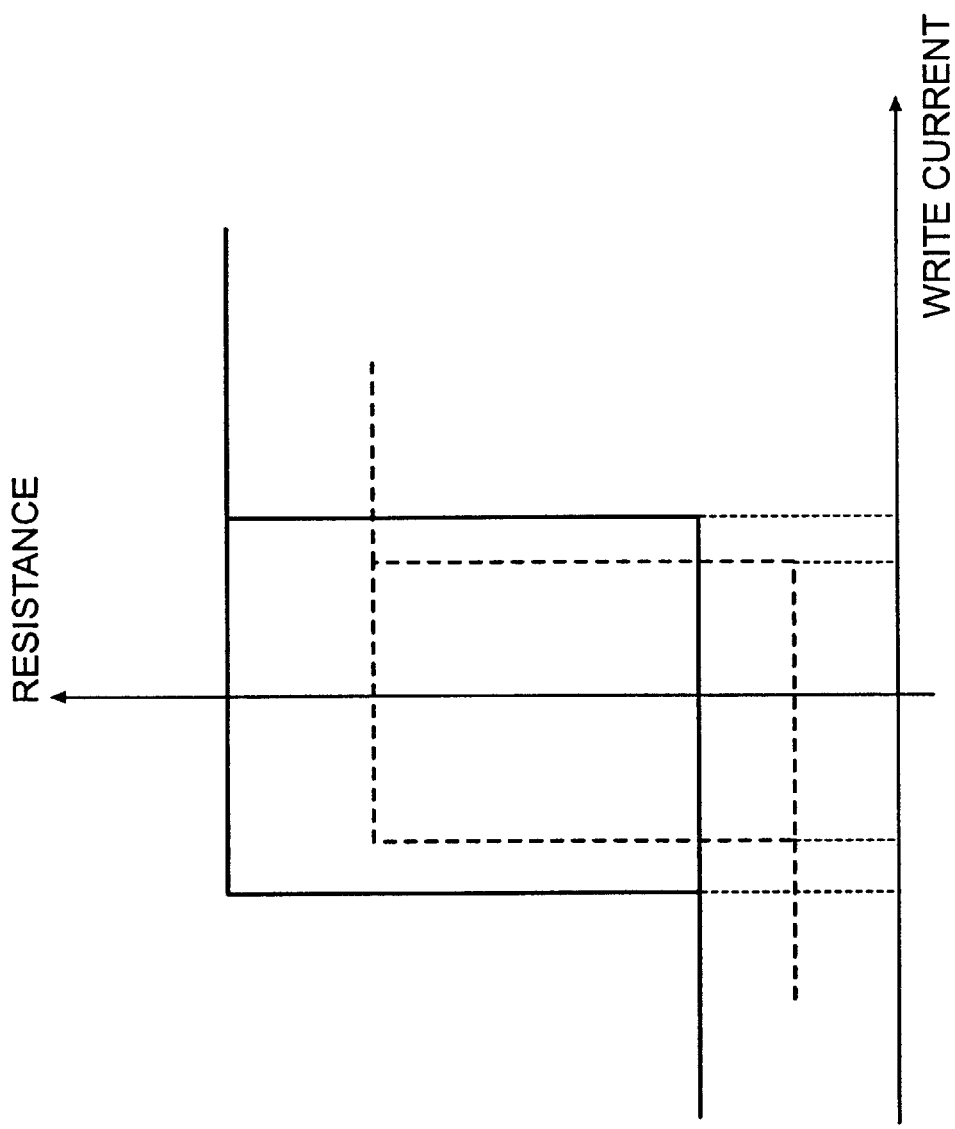
FIG. 5 illustrates memory cell switching curves.

FIG. 5 is a plot of memory cell switching curves, showing resistances of memory cells versus write current used to program the memory cells. The solid line curve indicates relative resistance values for a memory cell at room temperature when states of 1 and 0 are written to the memory cell. The dotted line indicates relative resistance values for a memory cell at an elevated temperature.

Figure 6:
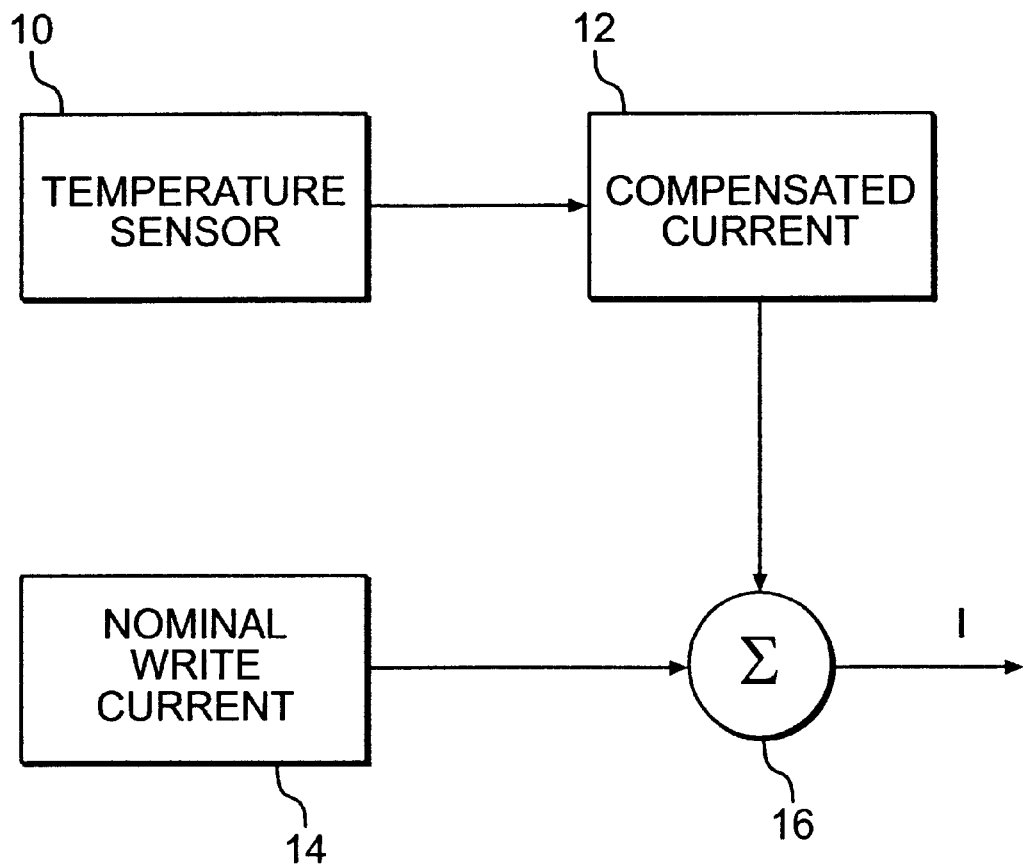
FIG. 6 is a process diagram illustrating compensation of a write current for temperature variations.

FIG. 6 is a process diagram illustrating compensation of a write current I for temperature variations. The write current I can represent either Ix or Iy. A temperature sensor, represented symbolically as element 10, provides an input to generate a compensated current 12, which is summed with a nominal write current 14 in a summation device 16. The generation of the write current I is discussed in detail below.

Figure 7:
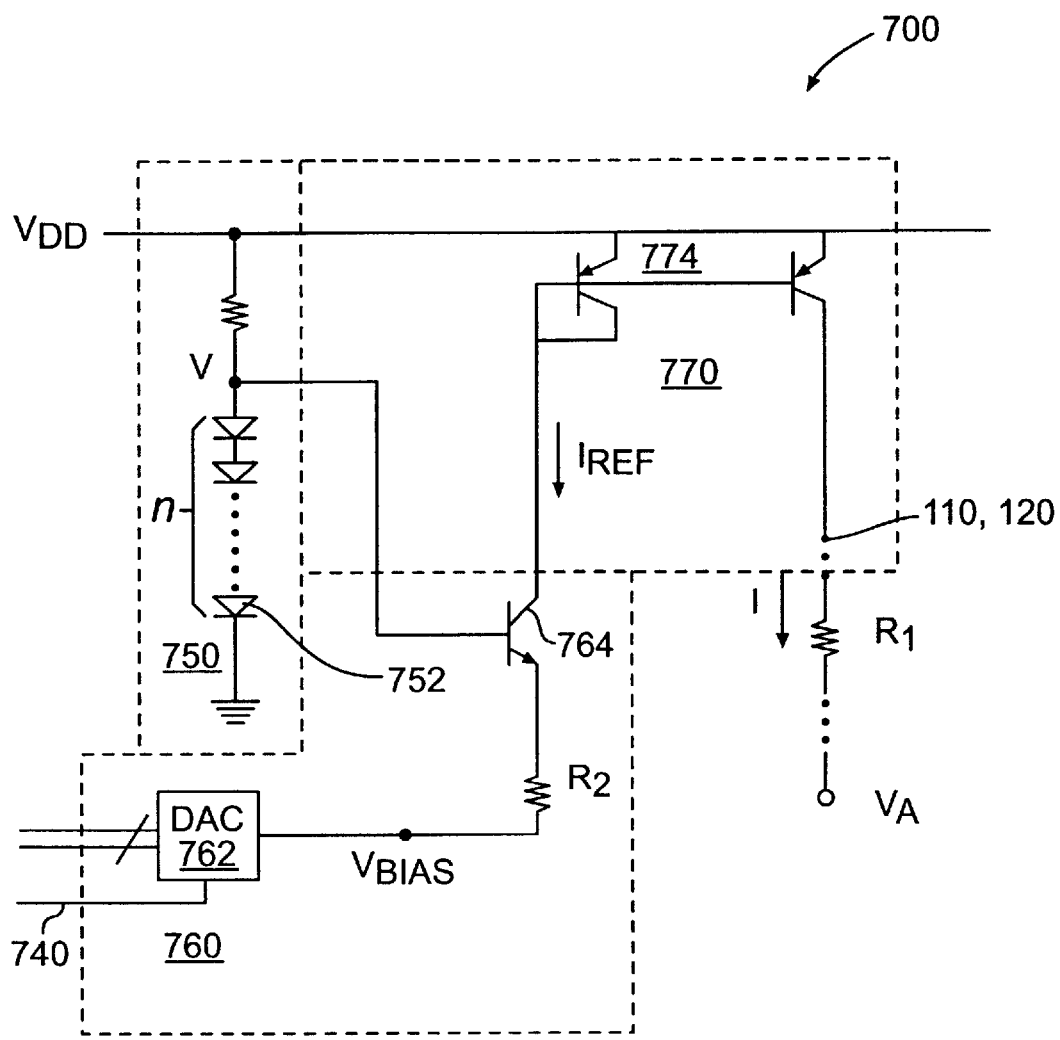
FIG. 7 is a schematic view of a current source according to a first embodiment.

FIG. 7 is a schematic view of an embodiment of the current source 700 including a temperature sensor 750. The current source 700 can correspond to any of the current sources 700 illustrated in FIG. 3. The current source 700 utilizes an output from the temperature sensor 750, and provides a variable current I in response to the output from the temperature sensor 750. In FIG. 7, the output from the temperature sensor 750 is a voltage V across the temperature sensor 750. The variable current I varies in order to compensate for coercivity changes in the memory cells 130 that occur due to temperature variations in the array 100 detected by the temperature sensor 750. The variable current I can be either a row write current Ix or a column write current Iy, depending on whether the current source 700 is coupled to row or column conductors. The current source 700 is illustrated as being connected to a conductor which can correspond to a row conductor 110 or a column conductor 120. The resistance $R_1$ indicates a resistance of a selected row or column conductor 110, 120.

The current source 700 also includes a set nominal current circuit 760 and an output current circuit 770. The set nominal current circuit 760 includes a programmable digital-to-analog converter (DAC) 762 for providing a bias voltage $V_{BIAS}$. The bias voltage $V_{BIAS}$ is coupled to the emitter of a transistor 764 through a resistor $R_2$. The temperature sensor 750 includes n active devices 752 that change in resistance as their temperatures change. The voltage V across the temperature sensor 750 is coupled to the base of the transistor 764. The number n of the active devices 752 is chosen so that the voltage V at the transistor 764 acts to compensate for changes in coercivity of the memory cells 130. The output current circuit 770 includes a current mirror 774 for mirroring a current $I_{REF}$ flowing into the collector of the transistor 764 to generate the write current I.

The current source 700 operates in the following manner: A voltage $V_{DD}$ is applied to the temperature sensor 750 and to the output current circuit 770. The bias voltage $V_{BIAS}$ from the DAC 762 sets a nominal operating current $I_{REF}$ at a nominal operating temperature. For example, if a write current I is to be generated in order to write to a selected memory cell 130, a low bias voltage $V_{BIAS}$ is generated by the DAC 762. If the current source 700 is not being used to generate a write current I, $V_{BIAS}$ can be set to a high value by an enable control line 740. The DAC 762 can be coupled to the controller 52 (see FIG. 3), and can receive commands from the controller 52 when a selected memory cell 130 is to be written to. The DAC 762 does not need to be programmed to vary $V_{BIAS}$ to compensate for temperature variations in the memory array 100. Instead, $V_{BIAS}$ can be set to generate a nominal value for $I_{REF}$ chosen as appropriate for programming a selected memory cell 130 when the memory array is at a predetermined nominal temperature.

The output voltage V across the temperature sensor 750, as sensed at the base of the transistor 764, adjusts the nominal $I_{REF}$ in accordance with the current temperature of the memory array 100. The current $I_{REF}$ is then mirrored in the current mirror 774, and applied to the conductor 110 or 120 as the write current I. In order to properly adjust the current $I_{REF}$, the voltage V across the temperature sensor 750 varies in accordance with the change in coercivity of the memory cells 130 as the temperature of the memory array 100 varies.

In the above embodiment, the transistor 764 acts as a control element that adjusts the current $I_{REF}$. The transistor 764 is illustrated as a three-terminal device with a base-to-emitter voltage $V_{BE}$ (i.e., $V_{BE}$ "ON") used to adjust $I_{REF}$. Other control elements, however, may be used.

According to the above embodiment, the write current I is automatically compensated for temperature variations in the memory array 100 by the effect of the voltage V. There is therefore no need to halt operation of the memory device 50 for calibration of the write current source 700. In addition, the temperature of the array 100 used to adjust the write current I is the current temperature of the memory cells 130.

The voltage V across the temperature sensor 750 can be constructed to vary in accordance with the change in coercivity of the memory cells 130 by selecting an appropriate number n of active devices 752 for the temperature sensor 750, wherein the active devices 752 have certain known properties. The selection of the number n of active devices 752 is discussed below.

In FIG. 7, the active devices 752 are illustrated as diodes. The voltage $V_{BE}$ across a diode is known to vary according to equation (1):

$$\frac{\partial V_{BE}}{\partial T} = k_1 \; \frac{mV}{°C.} \tag{1}$$

where:

$V_{BE}$ is the voltage across a diode ($V_{BE}$ "ON"); and $k_1$ is a constant dependent upon the properties of the diode.

In one embodiment, $k_1=-2$, in the case of a silicon $V_{BE}$ diode. The resistor $R_2$ can be, for example, a thin film resistor. A thin film resistor is known to vary according to equation (2):

$$\frac{\partial R}{R \cdot \partial T} = k_2 \; ppm/°C. \tag{2}$$

where:

$k_2$ is a constant dependent upon the materials and processes used to manufacture the thin film resistors.

In one embodiment, for a thin film resistor $R_2$, $k_2=1500$. From FIG. 7, the voltage drop V across the n diodes is:

$$V = n \cdot V_{BE}. \tag{3}$$

The current $I_{REF}$ is essentially equal to the current I as generated by the current mirror:

$$I_{REF} = I. \tag{4}$$

The current $I_{REF}$ can therefore be stated as:

$$I_{REF} = I = \frac{(n-1) \cdot V_{BE} - V_{BIAS}}{R_2} \quad (5)$$

where:

$V_{BIAS}$ is the bias voltage supplied by the DAC 762.

The change in current I with respect to temperature T can therefore be stated as:

$$\frac{\partial I}{\partial T} = \left[\frac{(n-1)}{R_2} \cdot \frac{\partial V_{BE}}{\partial T}\right] - \left[\frac{(n-1) \cdot V_{BE} - V_{BIAS}}{R_2}\right] \cdot \frac{\partial R_2}{R_2 \cdot \partial T}. \quad (6)$$

The rate of change in current I with respect to temperature T of the array 100 can be determined by experimental measurement of the rate of change in coercivity, or Hc, of the memory cells 130 with respect to temperature T. FIG. 4 is an example of coercivity versus temperature data that can be used to calculate a $$\frac{\partial I}{\partial T}$$

value for the array 100.

Once the rate of change in coercivity is determined, the rate of change of the required write current $$\frac{\partial I}{\partial T}$$

can be calculated. The calibration factor between the required change in write current I and the change in coercivity of the memory cells 130 can also be determined by experimental data. The number n of active devices can therefore be solved using equation (6).

By using an appropriate number n of active devices 752 in the temperature sensor 750, the temperature sensor 750 provides the proper output voltage V to the set nominal current circuit 760. The set nominal current circuit 760 can therefore ensure that the write current I is immediately adjusted to compensate for coercivity variations caused by temperature variations in the memory array 100.

The temperature sensor 750 can be located anywhere in the memory device 50 where the temperature of the memory cells 130 can be detected. Advantageously, the temperature sensor 750 can be located beneath the memory array 100. For example, the memory device 50 can comprise a semiconductor substrate (not illustrated), and the temperature sensor 750 can be disposed over the substrate in the vicinity of the memory cells 130, or in other locations if the temperature across the substrate is relatively uniform. Referring to FIG. 3, each current source 700 can include a separate temperature sensor 750, or a common temperature sensor 750 can be coupled to two or more of the current sources 700. The temperature of the array 100 may be relatively uniform across the array 100, and the temperature sensors 750 can be an integral part of the current sources 700. It is therefore not necessary to place temperature sensors in close proximity to the memory cells 130.

The above discussion assumes that the coercivity versus temperature function for the memory cells 130 is symmetric about a horizontal line, as shown in FIG. 4. If the parallel-to-anti-parallel and anti-parallel-to-parallel switching functions are asymmetric with respect to temperature variations, the current sources 700 can utilize a bias voltage $V_{BIAS}$ that varies depending upon the state to be written to a selected memory cell 130.

In FIG. 7, the active devices 752 are illustrated as $V_{BE}$ diodes. The diodes acts as transducers to convert the temperature of the array 100 into an output for use by the current source 700. In addition to diodes, other active devices that vary in resistance with changing temperature may also be used as transducers. Examples of alternative transducer devices include thermistors, zener diodes, and thin film resistors. These devices can be used alone or in combination with other temperature-sensitive transducer devices to provide an output to the current source 700.

Figure 8:
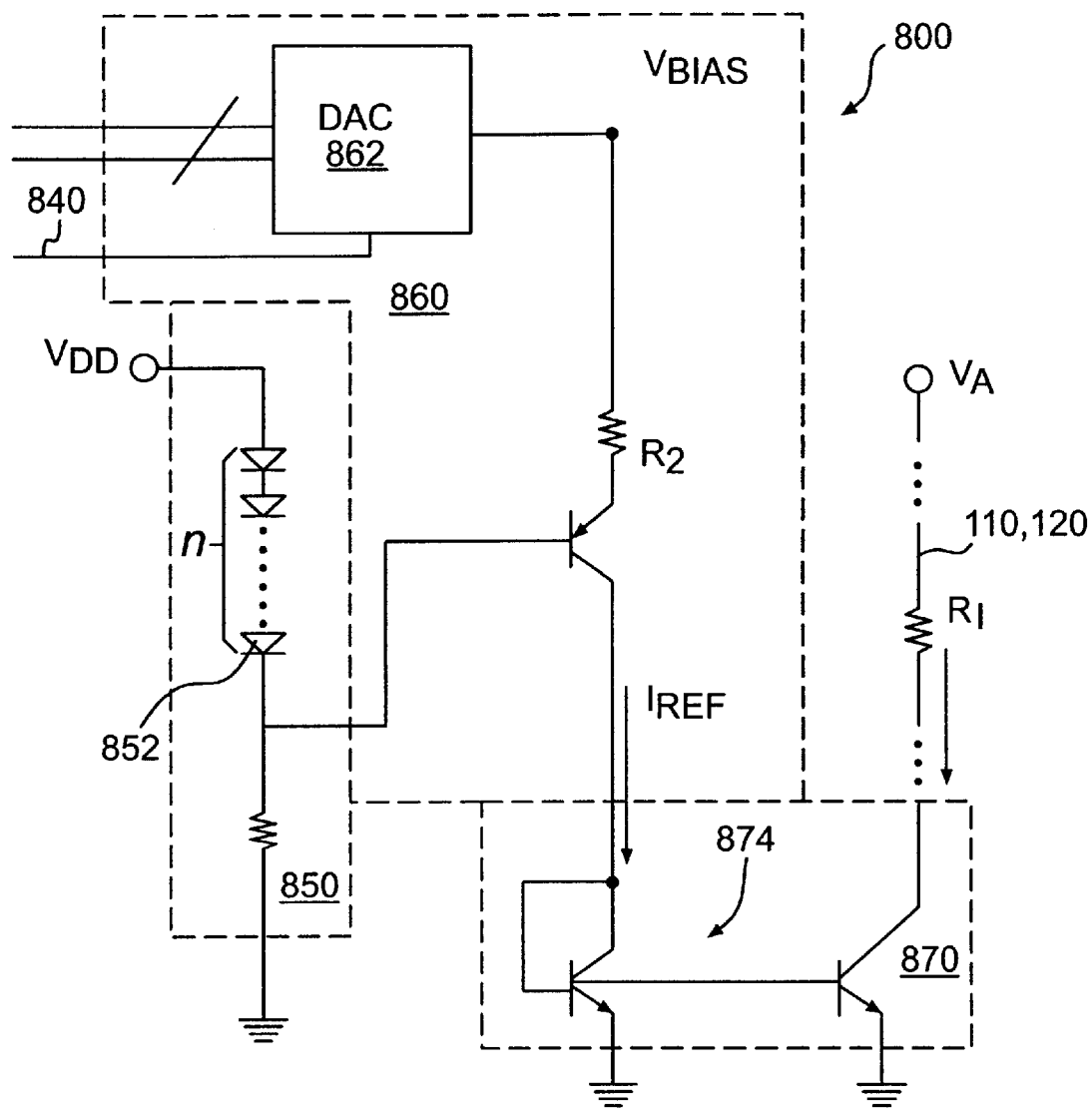
FIG. 8 is a schematic view of a current source according to a second embodiment.

FIG. 8 illustrates an alternative current source 800 having a temperature sensor 850. The current source 800 can be used in place of any of the current sources 700 illustrated in FIG. 3. The current source 800 utilizes an output from the temperature sensor 850 to provide a variable current I in response to the output from the temperature sensor 850. In FIG. 8, the output from the temperature sensor is a voltage V across the temperature sensor 850. The variable current I can be either a row write current Ix or a column write current Iy.

The current source 800 includes a set nominal current circuit 860 and an output current circuit 870. The set nominal current circuit 860 includes a programmable DAC 862 for providing a bias voltage $V_{BIAS}$. The bias voltage $V_{BIAS}$ is coupled to the collector of a transistor 864 through a resistor $R_2$. The temperature sensor 850 includes n active devices 852 that change in resistance as array temperature changes. The selection of the number n is discussed in detail below. The voltage V across the temperature sensor 850 is coupled to the base of the transistor control element 764, and acts to adjust $I_{REF}$ in accordance with varying temperature. The output current circuit 870 includes a current mirror 874 for mirroring a current $I_{REF}$ flowing from the emitter of the transistor 864.

The current source 800 operates in the following manner: A voltage $V_{DD}$ is applied to the temperature sensor 850. A voltage of $V_A$ is applied to the conductor 110, 120, where $V_A$ can be either $V_{DD}$ or $V_{DD}/2$, depending upon how the current source 800 is used in the memory device 50.

The bias voltage $V_{BIAS}$ from the DAC 862 determines whether the voltage $V_{DD}$ will be used to generate a write current I. If the current source 800 is not being used to generate a write current I, $V_{BIAS}$ can be set to a high value by an enable control line 840. The DAC 862 can be coupled to the controller 52 (see FIG. 3), and can receive commands from the controller 52 when a selected memory cell 130 is to be written to. The DAC 862 does not need to be programmed to vary $V_{BIAS}$ to compensate for temperature variations in the memory array 100. Instead, $V_{BIAS}$ can be set to generate a nominal value for current $I_{REF}$. The output voltage V across the temperature sensor 850, as sensed at the base of the transistor 864, adjusts $I_{REF}$ in accordance with the current temperature of the memory array 100. The current $I_{REF}$ is then mirrored in the current mirror 874.

In the above embodiment, the transistor 864 acts as a control element that adjusts the current $I_{REF}$ to compensate for temperature variations. The transistor 864 is illustrated as a three-terminal device with the base-to-emitter $V_{BE}$ voltage (i.e., $V_{BE}$ "ON") used to adjust $I_{REF}$. Other control elements, however, may be used.

The number n of active devices 852 can be selected in the following manner:

From FIG. 8:

$$V = V_{DD} - n \cdot V_{BE}. \quad (7)$$

I can be calculated by:

$$I = \frac{V_{BIAS} - (V + V_{BE})}{R_2}. \quad (8)$$

Therefore:

$$I = \frac{V_{BIAS} - V_{DD} + (n-1) \cdot V_{BE}}{R_2}. \quad (9)$$

The change in current with respect to temperature can be stated as:

$$\frac{\partial I}{\partial T} = \frac{(V_{BIAS} - V_{DD})}{R_2^2} \cdot \frac{\partial R_2}{\partial T} + \frac{(n-1)}{R_2} \cdot \frac{\partial V_{BE}}{\partial T} - \frac{(n-1) \cdot V_{BE}}{R_2^2} \cdot \frac{\partial R_2}{\partial T}. \quad (10)$$

$$\frac{\partial I}{\partial T}$$

can be rewritten as:

$$\frac{\partial I}{\partial T} = \frac{(V_{DD} - V_{BIAS})}{R_2} \cdot \frac{\partial R_2}{R_2 \partial T} - \frac{(n-1)}{R_2} \cdot V_{BE} \cdot \frac{\partial R_2}{R_2 \partial T} + \frac{(n-1)}{R_2} \cdot \frac{\partial V_{BE}}{\partial T}. \quad (11)$$

From these equations, the number n of active devices 852 can be calculated using experimental data and known properties for the active elements 852 and the resistor $R_2$.

Figure 9:
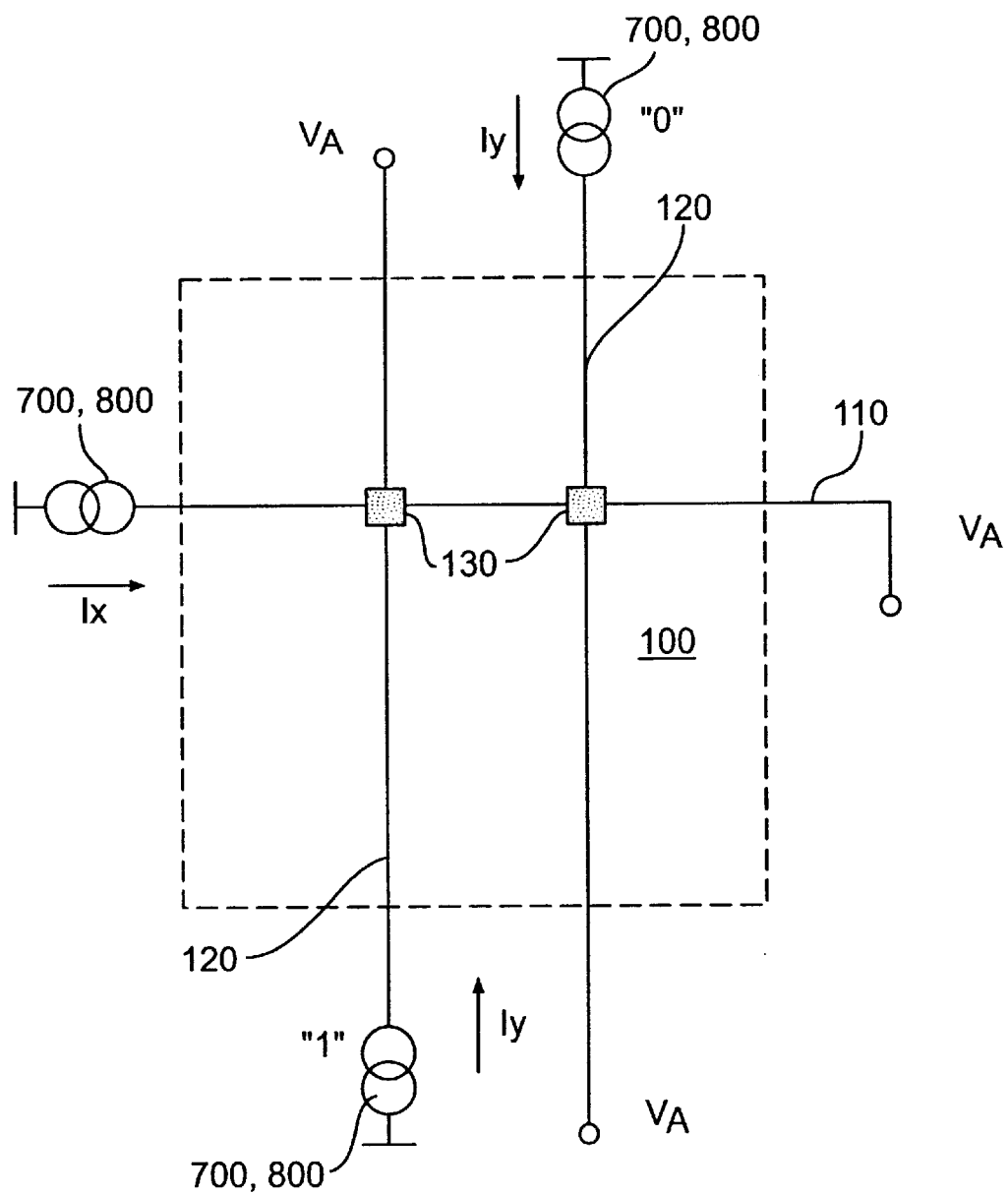
FIG. 9 is a simplified schematic view illustrating write operations for the memory array illustrated in FIG. 3.

FIG. 9 is a simplified schematic view illustrating write operations for the memory array 100 in the memory device 50 illustrated in FIG. 3. Either of the current sources 700 and 800 can be used in the write configuration illustrated in FIG. 9. In FIG. 9, the memory cell 130 to the left in the array 100 is being programmed with a binary state of 1, and the memory cell 130 to the right is being programmed to a binary state of 0. The switch banks 200, 300, 400 and 500, and other elements from FIG. 3, are not illustrated in FIG. 9.

If the write current source 700 is used to program the array 100, a voltage $V_A$ at ground potential can be used. If the write current source 800 is used to program the array 100, a voltage of $V_{DD}$ is applied to the conductors 110, 120, as illustrated in FIGS. 7 and 8. The voltages $V_{DD}$ can be applied to the row or column conductor 110, 120 at a side of the array 100 opposite to the location of the current source 800, as illustrated in FIG. 8.

Figure 10:
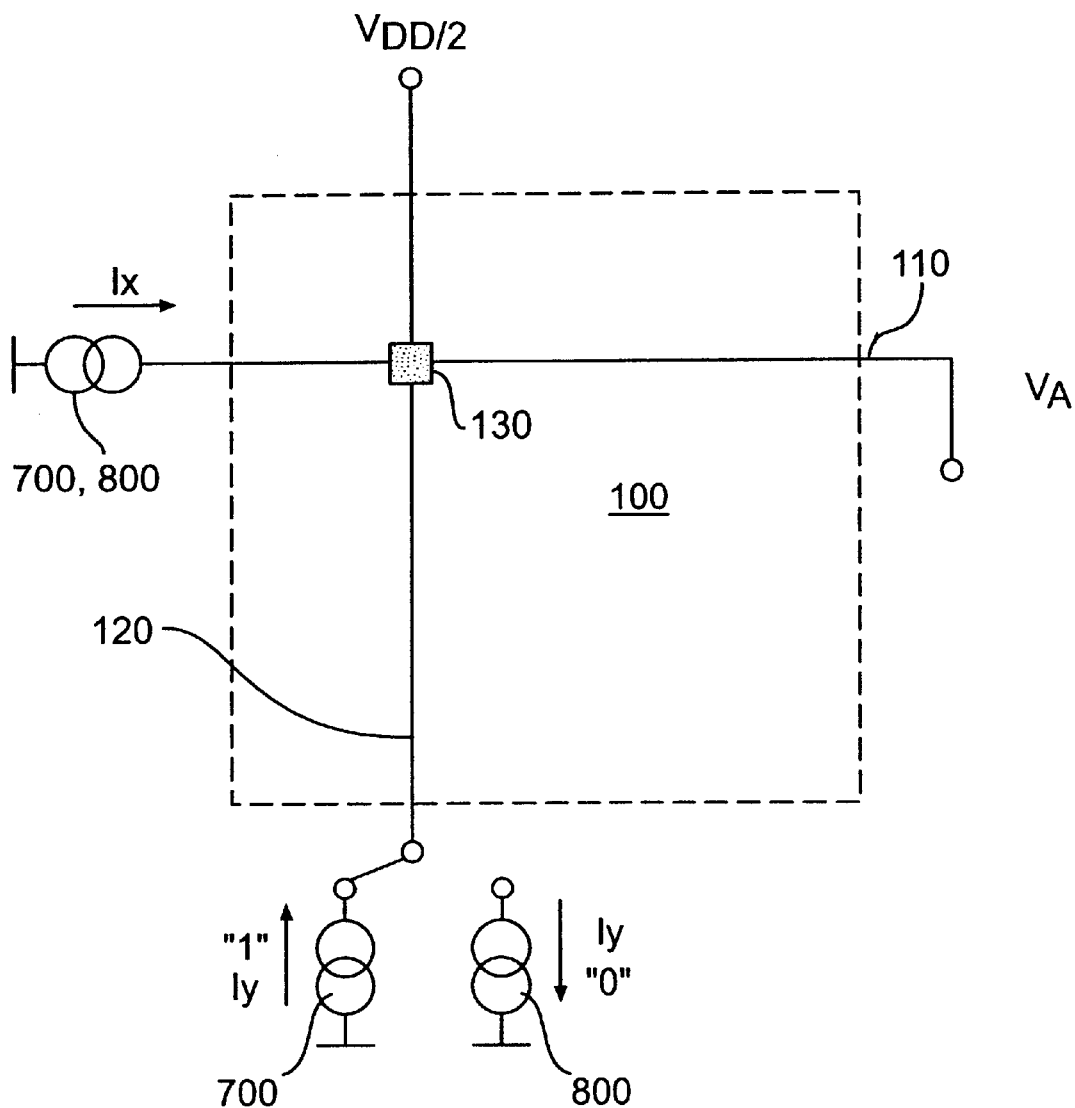
FIG. 10 is a simplified schematic view illustrating alternative write operations for the memory array illustrated in FIG. 3.

FIG. 10 is a simplified schematic view illustrating an alternative write operation for the memory array 100. In FIG. 10, either of the current sources 700 or 800 can be used to generate the row write current Ix. The current source 700 can be used to generate the column write current Iy to write a binary state of 1, and the current source 800 can be used to write a binary state of 0. The selective connection of the current sources 700 and 800 to the column conductor 120 can be effectuated by a switch 140.

In the schematic illustrated in FIG. 10, the current sources 700, 800 connected to the switch 140 can advantageously share a connection with a common temperature sensor. This feature reduces the number of switches coupling the sources 700, 800 to the conductors in the array 100.

Figure 11:
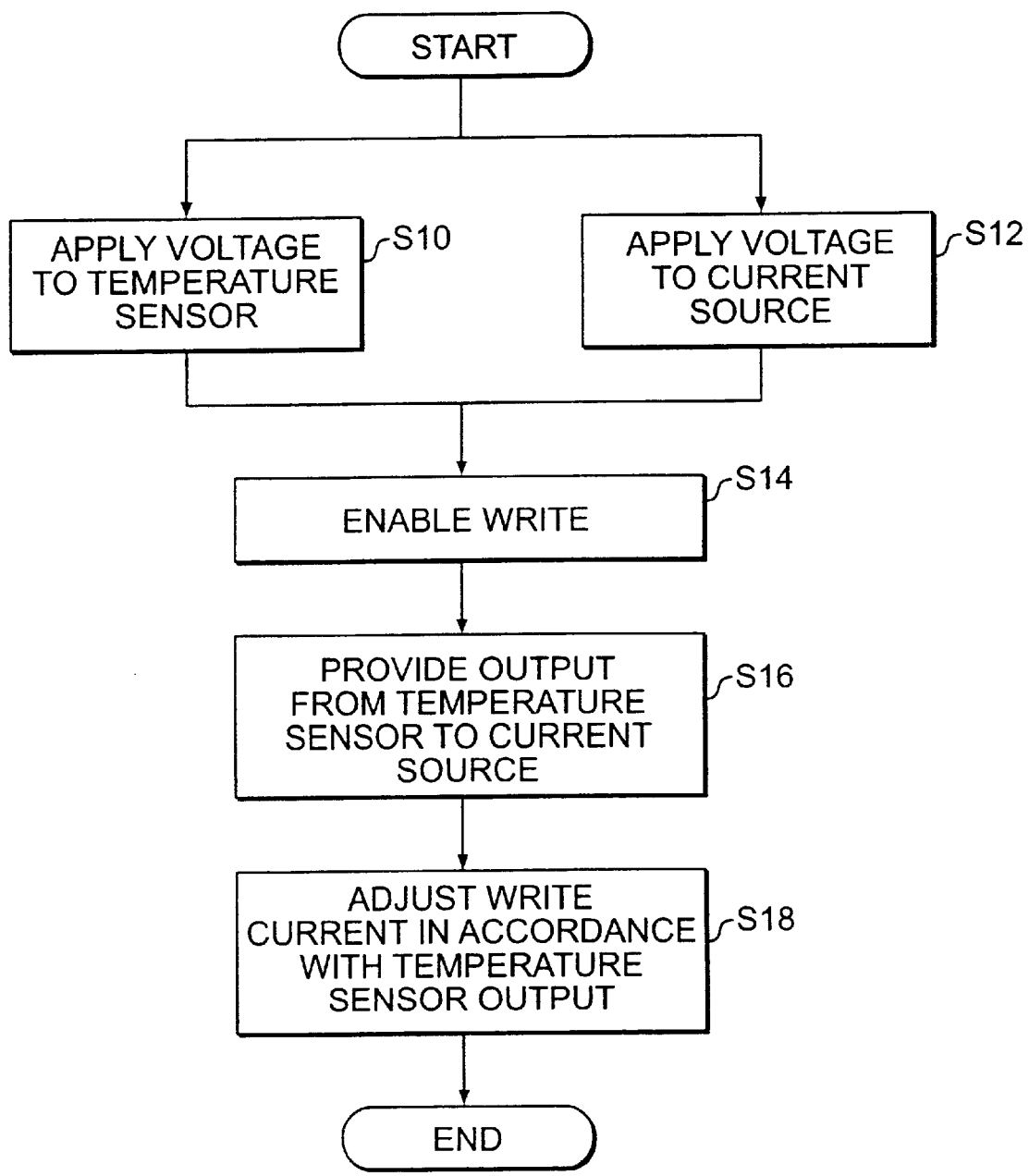
FIG. 11 is a flow chart illustrating a method for generating a write current.

FIG. 11 is a flow chart illustrating a method for generating a write current I for programming a selected memory cell 130 of the memory device 50. The method is discussed with reference to the current source 700 illustrated in FIG. 7. However, the method is also appropriate for generating a write current I using the current source 800 illustrated in FIG. 8. The write current I can be used as a write current Ix or Iy.

In step S70, a voltage is applied to the temperature sensor 750, and in step S12, a voltage is applied to the current source 700. If the temperature sensor 750 and the current source 700 are connected to a common voltage $V_{DD}$ as illustrated in FIG. 7, the application of voltage may be simultaneous. In the embodiment illustrated in FIG. 7, a voltage $V_{DD}$ is applied to both the temperature sensor 750 and to the output current circuit 770. The voltage or voltages applied to the temperature sensor 750 and the current source 700 can be applied continuously during operation of the memory device 50. The output of the current source 700 is connected to one side of a selected row or column conductor, and a ground potential is applied to the other side of the selected conductor.

In step S14, a write operation is enabled by the DAC 762. The controller 52 (see FIG. 3) can enable a write operation by sending a signal to the DAC 762 indicating that a write current I is to be generated by the current source 700. The DAC 762 can then set $V_{BIAS}$ so that $I_{REF}$ flows into the collector of the transistor control element 764. The currents I and $I_{REF}$ flow as a result of enabling the write operation. The write current I is generated by mirroring the reference current $I_{REF}$.

In step S16, the temperature sensor 750 provides the output voltage V to the control element 764. If the voltage $V_{DD}$ is continuously applied to the temperature sensor 750 during operation of the memory device 50, the voltage V will be maintained at the base of the transistor 764. The output voltage V will also vary continuously as the temperature of the memory array 100 varies.

In step S18, the write current I is adjusted according to the voltage V received at the transistor 764. The write current I is adjusted by the effect that the output voltage V has on $I_{REF}$ via the transistor control element 764. While this process is illustrated as a discrete step, the output voltage V from the temperature sensor 750 will in effect continuously adjust the write current I, because the resistance value of the active devices 752 will continuously vary with array temperature.

In order to program a selected memory cell 130, two write currents I, which may be Ix and Iy, are applied along row and column conductors, 110, 120, respectively. The above method can be used to generate both Ix and Iy.

According to the above method for generating a write current I, the temperature sensor 750 provides for continuous adjustment of the write current I to compensate for temperature variations in the memory array 100. The method therefore does not require a halt in operation of the memory device 50 to calibrate write circuitry. When a write operation is enabled, the write current I is automatically adjusted to compensate for temperature variations in the memory array 100.

As an additional advantage, there is no need for a reprogramming of write circuitry to calibrate the current source 700 for variations in array temperature. Once the temperature sensor 750 has been constructed to compensate for the change in coercivity of the memory cells 130, the memory device 50 can operate without calibration. In addition, the method ensures that a current temperature value is used to adjust the write current I.

The illustrated sense amplifier 600 in FIG. 3 is an example of a sensing device for detecting a binary state of a the memory cells 130 in the memory device 50. In practice, other sensing devices, such as a trans-impedance sense amplifier, a charge-injection sense amplifier, a differential sense amplifier, or a digital differential sense amplifier, for example, can be used. One sense amplifier 600 is illustrated in FIG. 3 for sensing the binary state of the memory cells 130. In practice, a greater number of sensing devices can be coupled to a memory array. For example, a sense amplifier can be included for each column conductor in a memory array.

The conventions for current flow to write states of 0 and 1 in the memory array are arbitrary, and can be reassigned to fit any desired application of the memory device 50.

The memory cells 130 used in the memory array 100 can be any type of memory cell responsive to write currents. For example, memory cells such as giant magnetoresistance (GMR) devices, magnetic tunnel junctions (MTJ), and other types of memory cells may be used in the memory array 50.

The memory array 50 can be used in a wide variety of applications. One application may be a computing device having an MRAM storage module. The MRAM storage module may include one or more MRAM memory arrays for long term storage.

MRAM storage modules can be used in devices such as laptop computers, personal computers, and servers.

A temperature compensated voltage source in accordance with the above embodiments could also be used in conjunction with a memory array.

While the memory device 50 is described with reference to exemplary embodiments, many modifications will be readily apparent to those skilled in the art, and the present disclosure is intended to cover variations thereof.

What is claimed is:

1. A method of generating a write current in a memory device, the memory device comprising an array of memory cells, a plurality of first conductors coupled to the memory cells, a plurality of second conductors coupled to the memory cells, and at least one current source having at least one temperature sensor, the method comprising:

enabling a write current to flow to one of the first conductors;

receiving an output from the temperature sensor in the current source; and generating the write current using the output from the temperature sensor.

2. The method of claim 1, wherein the step of receiving an output from the temperature sensor comprises:

receiving a voltage of the temperature sensor at a control element of the current source.

3. The method of claim 2, wherein the step of generating the write current comprises:

adjusting a reference current according to the voltage of the temperature sensor, wherein the write current varies according to the reference current.

4. The method of claim 1, wherein the step of generating the write current comprises:

adjusting the write current while the write current is generated.

5. The method of claim 4, comprising:

applying a voltage to the temperature sensor, wherein the temperature sensor comprises a plurality of active elements.

6. The method of claim 4, wherein the step of receiving an output from the temperature sensor comprises:

receiving the output while the write current is generated.

* * * * *